United States Patent [19]

Iyer et al.

[11] Patent Number: 5,760,337
[45] Date of Patent: Jun. 2, 1998

[54] THERMALLY REWORKABLE BINDERS FOR FLIP-CHIP DEVICES

[75] Inventors: Shridhar R. Iyer, Sugar Land; Pui Kwan Wong, Houston, both of Tex.

[73] Assignee: Shell Oil Company, Houston, Tex.

[21] Appl. No.: 767,058

[22] Filed: Dec. 16, 1996

[51] Int. Cl.$^6$ .................... H01L 21/56; H01L 23/28
[52] U.S. Cl. .................... 174/52.2; 524/789; 29/841; 428/903.3; 438/108; 438/118
[58] Field of Search .................... 524/789; 428/903.3; 174/52.2; 29/841; 438/108, 118

[56] References Cited

U.S. PATENT DOCUMENTS

| | | | |
|---|---|---|---|
| 3,979,373 | 9/1976 | Kiovsky et al. | 525/55 |
| 4,826,932 | 5/1989 | Wong | 528/392 |
| 5,120,665 | 6/1992 | Tsukagoshi et al. | 437/8 |
| 5,120,678 | 6/1992 | Moore et al. | 174/52.2 |
| 5,274,913 | 1/1994 | Grebe et al. | 29/841 |
| 5,292,688 | 3/1994 | Hsiao et al. | 437/209 |
| 5,374,701 | 12/1994 | Hay et al. | 528/374 |
| 5,390,082 | 2/1995 | Chase et al. | 174/52.2 |

OTHER PUBLICATIONS

"Cleavable Epoxy Resins: Design for Disassembly of a Thermoset," by S. L. Buchwalter and L. L. Kosbar, *Journal of PolymerScience: Part A: Polymer Chemistry*, vol. 34, pp. 249–260 (1996).

"A Novel Chip Replacement Method for Encapsulated Flip Chip Bonding," by Y. Tsukada, Y. Mashimoto, N. Watanuki, Proceedings of the 43rd Electronic Components and Technology Conference 1993, IEEE, pp. 199–204.

"Encapsulant for Fatigue Life Enhancement of Controlled Collapse Chip Connection (C4)," by D. W. Wang and K. I. Papathomas, IEEE Transactions on Components, Hybrids and Manufacturing Technology, 16(8), Dec. 1993, pp. 780–784.

*Primary Examiner*—Tae Yoon

[57] ABSTRACT

A semiconductor device is attached to a supporting substrate by a plurality of solder connections that extend from the supporting substrate to the semiconductor device and the gap between the supporting substrate and the semiconductor device is filled with a reworkable composition comprising:

(a) a thermally reworkable crosslinked resin produced by reacting at least one dienophile having a functionality greater than one and at least one 2,5-dialkyl substituted furan-containing polymer, and (b) at least one filler present in an amount from about 25 to about 75 percent by weight based upon the amount of components (a) and (b). Such a process provides a readily reworkable semiconductor assembly.

30 Claims, No Drawings

THERMALLY REWORKABLE BINDERS FOR FLIP-CHIP DEVICES

FIELD OF INVENTION

This invention relates to a thermosetting binder. In one aspect, the invention relates to thermosetting binders suitable for encapsulating the gap between a flip-chip and a substrate.

BACKGROUND OF THE INVENTION

Controlled collapse chip connection (C4) or flip chip technology was introduced in the 1960s as a method to connect a passivated semiconductor device to a substrate such as a ceramic carrier by means of solder bumps (Microelectronics Packaging Handbook, R. Tummala and E. J. Rymaszewski, Van Nostrand Reinhold, N.Y. 1989). High melting solder bumps on the device were mated with corresponding pads on the substrate and the solder on the substrate was flowed to form a conductive bond between the device and the substrate. Later, it was found that the presence of a binder (flip chip encapsulant), usually a filled thermosetting binder greatly enhanced the fatigue life performance of the device in addition to protecting it against moisture and the surrounding environment.

Flip chip technology is rapidly gaining in popularity due to a number of reasons that include high density in area and volume, small footprint, high productivity, and the avoidance of time consuming and costly processing steps involved in existing packaging technologies such as resin transfer molding to encapsulate chips. A variety of substrates or chip carriers such as ceramic (e.g. alumina) and organic (e.g. epoxy/glass fabric laminates) are used in this technology. With the advent of package configurations such as multichip modules, closer die-to-die spacing and flip chip placement in expensive multicomponent boards, repair and rework of defective flip chips is rapidly becoming an increasing concern. A typical flip chip process (Y. Tsukada, Y. Mashimoto, N. Watanuki, Proceedings of the 43rd Electronic Components and Technology Conference 1993, IEEE, p199–204) may involve building solder bumps on the carrier, applying solder paste, placing bumped flip chip along with other components such as SMT (surface mount technology) chips, resistors, etc. if the carrier is a multicomponent board, infrared reflowing, inspecting by X-ray, electrical testing, flip chip encapsulation and postbaking followed by final inspection. If the flip chip is found to be defective at the electrical testing step, then the chip is removed by applying heat, bump is redressed, replacement chip placed and sent back to the above process. If the chip is found to be defective after final inspection, heat is accompanied by shearing to break the crosslinked epoxy and remove the chip. This is followed by a cumbersome site redress step due to the presence of crosslinked material, chip placement, IR reflow and the other successive steps in the above process.

A conventional flip chip binder is a thermosetting system that is irreversibly crosslinked after it is dispensed under the chip. An example formulation (D. W. Wang, and K. I. Papathomas, IEEE Transactions on Components, Hybrids and Manufacturing Technology, 16(8), December 1993, p 863–867) is a liquid epoxy resin such as a bisphenol-A epoxy or cycloaliphatic epoxy, a curing agent such as anhydride with a suitable accelerator, fillers such as silica and other additives.

Reworking of the semiconductor device is an expensive and time consuming process. Currently, if the device needs to be replaced, the device must be removed by destructive methods such as described above. Thus, it is desirable to provide a flip chip assembly and a process that allows the reworking to be easier and non-destructive.

SUMMARY OF THE INVENTION

According to the invention, a thermally reworkable encapsulated flip chip assembly is provided comprising: a supporting substrate; at least one semiconductor device attached to said supporting substrate by means of a plurality of solder connections that extend from the supporting substrate to the semiconductor device to form a gap between said supporting substrate and said semiconductor device; and a thermally reworkable binder filling said gap, said thermally reworkable binder comprising:

(a) a thermally reworkable crosslinked resin produced by reacting at least one dienophile having a functionality greater than one and at least one 2,5-dialkyl substituted furan-containing polymer, and (b) at least one filler present in an amount from about 25 to about 75 percent by weight based upon the amount of components (a) and (b) thereby providing an assembly.

DETAILED DESCRIPTION OF THE INVENTION

There may be several ways by which the polymer chains of the thermally reworkable crosslinked resin can be produced. The thermally reworkable crosslinked resin can be produced by reacting at least one dienophile having a functionality greater than one and at least one 2,5-dialkyl substituted furan-containing polymer connecting to one another via Diels-Alder addition. In one embodiment the 2,5-dialkyl substituted furan groups are attached to or form part of the polymer chains.

The reversible furan to dienophile reaction to form the Diels-Alder adduct can be represented by:

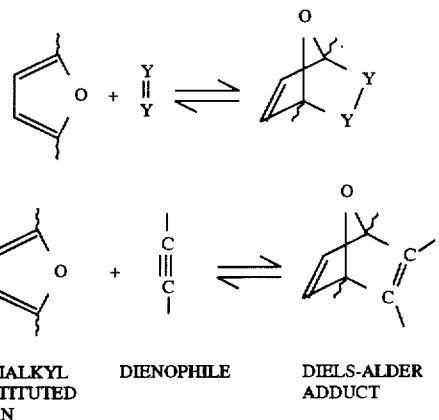

2,5-DIALKYL SUBSTITUTED FURAN    DIENOPHILE    DIELS-ALDER ADDUCT where Y is either C< or N–.

For a thermally reworkable crosslinked resin, all or a portion of the Diels-Alder adduct can revert to the furan and dienophile upon heating such that the resin is a liquid (flowable material).

A crosslinking agent which contains in its molecular structure two or more dienophiles can also be used in this embodiment. These dienophiles are connected to each other by chemical bonds or by bridging groups. Accordingly, the present invention also contemplates a flip chip binder composition (encapsulant) containing a polymer which comprises moieties of a 2,5-dialkyl substituted furan and a crosslinking agent which comprises two or more dienophiles in its molecular structure. The dienophiles may also be attached to or form part of the polymer chains. A crosslinking agent which comprises in its molecular structure two or more 2,5-dialkyl substituted furan groups can also be used.

In yet another embodiment the dienophile is attached to the polymer chains to which the 2,5-dialkyl substituted furan groups are also attached or which contain the 2,5-dialkyl substituted furan groups as a part of their polymer chains. Accordingly, the 2,5-dialkyl substituted furan-containing polymer can also contain moieties of a 2,5-dialkyl substituted furan and moieties of a dienophile.

The 2,5-dialkyl substituted furans may or may not be substituted at their 3-and 4-positions. Preferred substituents are inert substituents such as for example alkyl or alkyloxy groups, typically having up to 10 carbon atoms, such as methyl, ethyl, 1-propyl, methoxy and 1-hexyloxy groups. Resins containing furans whose 2 and 5 positions are not substituted are susceptible to side reactions which can cause irreversible gelling and interfere with its reversibility.

The 2,5-dialkyl substituted furan groups may be attached to the polymer chains of the polymer(s) on which the crosslinked resin is based. They may be attached thereto directly via a chemical bond or via a divalent organic bridging group for which any of the substituents of the furans or the 3- or 4-positions of the furans may function as the point of attachment. The alkyl substituents at the 2- and 5-positions of the furans may be the same or different and will typically have up to 10 carbon atoms. Examples of suitable alkyl groups are methyl, ethyl, 2-propyl and 1-hexyl groups. Examples of suitable furyl groups which can be attached to a polymer chain are 2,5-dimethylfur-3-yl, 2,5-diethyl-3-methyl-fur-4-yl, 5-ethylfurfuryl or 5-(1 -butyl) furfuryl groups.

The type of polymer chains to which the 2,5-dialkyl substituted furan groups may be attached is not critical. Suitably the polymer chains are chains of a polyolefin, such as polyethene, polypropene, polystyrene, poly(acrylic acid) or a copolymer of ethene and acrylic acid or ester, chains of random or alternating copolymers of carbon monoxide and olefinically unsaturated compounds (for a further elaboration on such copolymers cf. hereinafter), or chains which contain heteroatoms, such as chains of polyamide or polyester. It is preferred that the 2,5-dialkyl substituted furans form a structural element of the polymer backbone itself. In such a case it is particularly preferred that each of the 2,5-dialkyl substituents of the furans are alkylene groups which also form part of the polymer chain and which may or may not be substituted.

Such a structure can be produced by furanizing copolymers of carbon monoxide and olefinically unsaturated compounds which contain 1,4-dicarbonyl entities in their polymer chains, i.e. by converting such 1,4-dicarbonyl entities into furan moieties. Alternatively, a 2,5-dialkyl substituted furan-containing polymer can be directly produced by reacting carbon monoxide and olefinically unsaturated compounds in the presence of a strong acid.

Perfectly alternating copolymers of carbon monoxide and olefinically unsaturated compounds which contain 1,4-dicarbonyl entities in their polymer chains are known. They can be prepared by palladium catalyzed polymerization using the methods known from, for example, EP-A-121965, EP-A-181014 and EP-A-516238. The polymers so prepared are alternating copolymers of carbon monoxide and the olefinically unsaturated compounds, i.e. copolymers of which the polymer chains contain the monomer units originating in carbon monoxide (i.e. carbonyl groups) and the monomer units originating in the olefinically unsaturated compounds in an alternating arrangement so that every fourth carbon atom of the polymer chain belongs to a carbonyl group. Alternative copolymers of carbon monoxide and olefinically unsaturated compounds which contain 1,4-dicarbonyl entities may be random copolymers, i.e. copolymers of which the polymer chains contain monomer units in a random order. The latter copolymers can be prepared by radical initiated polymerization using the methods known from, e.g., U.S. Pat. No. 2,495,286 and U.S. Pat. No. 4,024,326.

The furanization of the copolymer of carbon monoxide and olefinically unsaturated compounds may be effected by methods known in the art, for example, by applying phosphorus pentoxide as dehydrating agent, as disclosed by A. Sen et al. (J. Polym. Science, Part A, Polym. Chem. 32 (1994) p. 841), or by heating in the presence of a strong acid, such as p-toluenesulphonic acid, as disclosed in U.S. Pat. No. 3,979,373. These methods allow the conversion of 1,4-dicarbonyl moieties in the polymer chains into furan moieties at a variable conversion level, depending upon the reaction conditions selected.

It is preferred to employ in the furanization an alternating copolymer of carbon monoxide and olefinically unsaturated compounds because these have a higher content of 1,4-dicarbonyl groups in the polymer back-bone so that the furanization can be accomplished efficiently at a high level of incorporation of furan groups. If, nevertheless, a low degree of furanization is desired, the conversion of carbonyl groups into furan groups may be kept low.

The copolymers of carbon monoxide and olefinically unsaturated compounds may be based on hydrocarbons as the olefinically unsaturated compounds. It is preferred that the copolymer is based on an olefinically unsaturated hydrocarbon, suitably an α-olefin, in particular an α-olefin having up to 10 carbon atoms. Very suitable are aliphatic α-olefins, in particular those having from 3 to 6 carbon atoms and more in particular those having a straight carbon chain, such as propene, 1-butene, 1-pentene and 1-hexene. Propene is most preferred. The copolymer can be regioregular or irregular, stereoregular or atactic.

A 2,5-dialkyl substituted furan-containing polymer where a polymer based on propene and carbon monoxide are furanized can be represented by the formula:

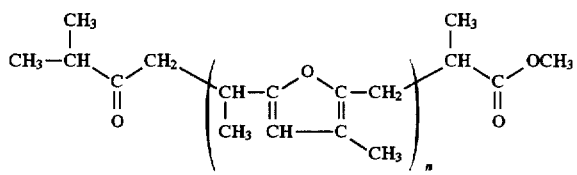

The precise nature of the dienophile from which the Diels-Alder adduct is obtained is not critical, as long as the Diels-Alder adduct has such a thermal stability that the crosslinked resin is reworkable. Usually the minimum temperature above which the reworkable crosslinked resin will be reworked depends on the maximum temperature requirements for the semiconductor device used. The reworking is suitably carried out at a temperature from about 100° C., preferably from about 130° C., to about 250° C., preferably to about 200° C.

Suitable dienophile functionality can be represented by Y=Y where Y is either C< or N—, or —C≡C—. Preferably the dienophiles are, for example, alkynes having electron withdrawing groups attached to both sides of the ethyne moiety, such as ester and keto groups. Examples are monoand diesters of butynedioic acid (i.e. acetylenedicarboxylic acid) and substituted but-2-yne-1,4-diones. Other suitable dienophiles are compounds which contain a but-2-ene-1,4-dione moiety included in a 5- or 6-membered ring, in particular compounds of the general formula:

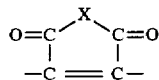

wherein X denotes O, S, N, P, or R where R is alkylene, wherein at least one of the free valencies is occupied by a bridging group which connects the dienophile with one of the polymer chains or with another dienophile, and wherein the remaining valencies, if any, are occupied by lower alkyl or acyl substituents or, preferably, hydrogen. The lower alkyl substituents suitably contain up to 4 carbon atoms and are, for example, methyl or ethyl groups. Dienophiles of this general formula are preferably cyclic derivatives of maleic anhydride and, in particular, maleimide (i.e. X denotes O or, in particular, N—).

Examples of other suitable dienophiles include, bis (triazolinediones), bis(phthalazinediones), quinones, bis (tricyanoethylenes), bis(azodicarboxylates); diacrylates, maleate or fumarate polyesters, acetylenedicarboxylate polyesters.

As indicated hereinbefore, in one embodiment use is made of a crosslinking agent which comprises in its molecular structure two or more dienophiles from which the Diels-Alder adducts are obtainable. The dienophiles may be connected to each other by one or more bridging groups. For example, three dienophiles may be connected to one another by a trivalent bridging group. However, it is sufficient that a crosslinking agent is used in which two dienophiles are connected to one another by a bivalent bridging group. The dienophiles may also be connected to one another by chemical bonds.

Both the molecular weight and the chemical nature of the bridging group of the crosslinking agent may be varied to a large extent. It has been found that such variations of the crosslinking agent lead to re-moldable crosslinked resins covering a wide range of mechanical properties. The bridging group may contain only carbon atoms in the bridge but it is also possible that it contains heteroatoms in the bridge, such as oxygen, silicon or nitrogen atoms. The bridging group may be flexible or rigid.

For example, polymeric bridging groups having flexible polymer chains, such as poly(alkylene oxide) or polysiloxanes, having a number average molecular weight of, say, more than 300, provide rubbery reworkable crosslinked resins. When the polymeric flexible chain has a number average molecular weight in the order of 1500–5000 or more, reworkable crosslinked resins may be obtained which could replace thermoplastic rubbers.

Accordingly, suitable crosslinking agents of this kind are the bis-maleimido-capped poly(alkylene oxide)s, such as poly(ethylene oxide)s or poly(propylene oxide)s, and bismaleimido-capped polysiloxanes, for example the bismaleimides of polysiloxanes of the general formula $H_2N—CH_2[—O—SiR_2]_n—O—CH_2—NH_2$, wherein n is an integer, on average, of more than 10 and in particular in the range of 20–70, and each R is independently an alkyl group, in particular having up to 5 carbon atoms, preferably a methyl group. Very good results can be obtained with the bismaleimide of bisamino-capped poly(propene oxide), in particular having a number average molecular weight of at least 300, more in particular in the range of 1500–5000.

Low-molecular weight bridging groups, i.e. bridging groups which typically have up to 20 carbon atoms in the bridge, may also be used. Cycloaliphatic and aromatic bridging groups render the bridging groups rigid. Low-molecular weight cycloaliphatic and aromatic bridging groups tend to provide re-moldable crosslinked resins which are hard and brittle, and have a relatively high glass transition temperature. Examples of cycloaliphatic and aromatic low-molecular weight bridging groups are groups containing a norbornane skeleton in the bridge, 1,3-phenylene groups and groups of the following formulae: —f—$CH_2$—f—, —f—O—f—O—f—, —f—O—f—$SO_2$—O—f— and —f—$C(CH_3)_2$—f—, wherein —f— denotes a 1,4-phenylene group. Other suitable bridging groups are alkylene and oxycarbonyl (ester) groups and combinations thereof. Suitable low-molecular weight crosslinking agents are, for example, the bismaleimides of hydrazine, 2,4-diaminotoluene, hexamethylenediamine, dodecamethylenediamine, diamines of the general formula:

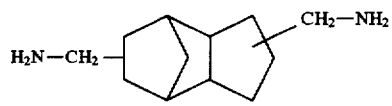

and bisamino-capped (poly)siloxanes of low molecular weight, such as polysiloxanes of the general formula $H_2N—CH_2[—O—SiR_2]_n—O—CH_2—NH_2$, wherein n ranges, on average, from 1 to 10, preferably from 1 to 5 and the groups R are preferably methyl groups. An isomer mixture of the diamines of above formula is commercially available from HOECHST. Very good results can be obtained with bis(4-maleimidophenyl)methane and dimethylbis[(N-maleimidomethyl)oxy]silane.

Other suitable crosslinking agents on the basis of maleic anhydride are compounds of the general formula:

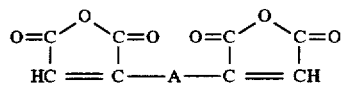

wherein A denotes a bridging group as described hereinbefore, in particular bridging group having up to 20 carbon atoms in the bridge. More in particular the bridging group A is an alkylene group, such as a hexamethylene group, or groups —D—O—CO— or —CO—O—D—O—CO— wherein D denotes a bivalent hydrocarbyl group, for example an alkylene group, such as a hexamethylene group.

Again other suitable crosslinking agents are polyesters based on butynedioic acid and a diol, such as ethylene glycol, a poly(ethylene glycol), propylene glycol or a poly (propylene glycol). These polyesters may be low molecular weight crosslinking agents, such as described hereinbefore, or they may have a number average molecular weight of, for example, more than 400, such as in the range of 2000–6000.

The present invention also relates to crosslinking agents such as bis-maleimido-capped poly(alkylene oxide)s, in particular bismaleimido-capped poly(propene oxide)s. Such agents have a number average molecular weight of at least 300, preferably in the range of 1500–5000. The bismaleimides of polysiloxanes have the general formula $H_2N—CH_2[—O—SiR_2]_n—O—CH_2—NH_2$, wherein n is an integer of at least 1 and each R is independently an alkyl group, in particular having up to 5 carbon atoms, preferably a methyl group. The bismaleimido-capped polysiloxanes can be prepared by N-hydroxymethylation of maleimide with formaldehyde and subsequent reaction with the appropriate dichloro-dialkylsilane in the presence of base and water using generally known methods.

As noted above, certain embodiments relate to a crosslinking agent which comprises in its molecular structure 2,5-dialkylfuran moieties. In this crosslinking agent, the 2,5-dialkyl substituted furan groups can be connected to one another via a chemical bond or via a bridging group. The nature of this bridging group is generally the same as the bridging group of the crosslinking agents which comprise two or more dienophiles, as described hereinbefore. Examples of suitable crosslinking agents are bis(5-ethylfurfuryl) adipate and the bis-amides of (5-ethylfurfuryl) acetic acid and the diamines mentioned in the is preceding paragraphs.

The 2,5-dialkyl substituted furan moieties and/or moieties of a dienophile may be connected to the polymer chains by means of a chemical bond or by means of a bridging group. This bridging group may be of the same type as the bridging groups of the crosslinking agents. Examples may be given as follows. When the polymer is a polystyrene, maleimide, as the dienophile, may be attached thereto by tin(IV)chloride catalyzed alkylation of the polystyrene with N-chloromethylmaleimide, and when the polymer is a (styrene/maleic anhydride)copolymer a 5-ethylfurfuryl group may be attached thereto by esterifying the (styrene/ maleic anhydride)copolymer with 5-ethylfurfuryl alcohol in pyridine. When the polymer is a copolymer of carbon monoxide and olefinically unsaturated compounds which comprises 1,4-dicarbonyl entities in their polymer chains, 2,5-dialkylfurans and dienophiles may be attached thereto by reacting the copolymer with an appropriately substituted primary hydrocarbylamine, e.g., using the methods known from U.S. Pat. No. 3,979,374. In this reaction 1,4-dicarbonyl entities are converted into pyrrole entities which form part of the polymer chain and which are N-substituted with the substituted hydrocarbyl group. For example, a copolymer of carbon monoxide and olefinically unsaturated compounds which comprise 1,4-dicarbonyl entities may be reacted with the mono-amide of maleic acid and hexamethylenediamine or with the mono-amide of maleic acid and bis(4-aminophenyl)methane, followed by ring closure of the acid-amido moieties to maleimide moieties. This will yield a polymer having N-(6-maleimidohexyl)pyrrole or N-{4-[(4'-maleimidophenyl)methyl]phenyl}pyrrole entities in the polymer chain. When it is desired to use a polymer which contains 2,5-dialkyl substituted furan moieties and moieties of a dienophile a portion of the 1,4-dicarbonyl entities of a copolymer of carbon monoxide and olefinically unsaturated compounds may be converted into furan moieties and another portion of the 1,4-dicarbonyl entities may be converted into N-substituted pyrrole entities, of which the N-substituent comprise a dienophile.

The molecular weight of the polymer(s) on which the reworkable crosslinked resin is/are based may vary between wide limits. Suitably the polymer may have a number average molecular weight within the range of at least 500, preferably 700, to about 30,000, preferably to about 20,000.

The quantity of Diels-Alder adducts present in the thermally reworkable crosslinked resin depends on the quantity of 2,5-dialkyl furan groups and the quantity of the dienophile present in the composition from which the Diels-Alder adducts are formed. One skilled in the art will appreciate that a certain minimum quantity of Diels-Alder adducts is needed to be present to effect that the crosslinked resin is a solid material below the temperature at which the Diels-Alder adducts reverse to the 2,5-dialkyl substituted furan and the dienophile. It will also be appreciated that this minimum quantity depends on the molecular weight and the type of the polymer on which the resin is based and, if any crosslinking agent is used, on the number of dienophiles or 2,5-dialkyl furan groups per molecule (i.e. functionality) of the crosslinking agent. Lower molecular weights of the polymer will require a higher quantity of Diels-Alder adducts. The number of a Diels-Alder adducts may be lower when a crosslinking agent is used which has a higher functionality.

Generally good results can be achieved by using the 2,5-dialkyl furan-containing polymer having a furan groups to ketone groups ratio of from about 1:16 to about 4:1. The molar ratio of the 2,5-dialkyl substituted furan groups to dienophiles amounts typically from about 10:1 to about 1:5, preferably from about 5:1 to about 1:3.

An encapsulated flip chip assembly between a semiconductor device and a supporting substrate is provided by attaching the semiconductor device to the supporting substrate by a plurality of solder connections that extend from the supporting substrate to semiconductor device to form a gap between said supporting substrate and said semiconductor device, filling said gap with a thermally reworkable composition comprising:
  (a) a thermally reworkable crosslinked resin produced by reacting at least one dienophile having a functionality greater than one and at least one 2,5-dialkyl substituted furan-containing polymer, and
  (b) at least one filler present in an amount from about 25 to about 75 percent by weight based upon the amount of components (a) and (b) thereby providing an assembly.

The gap between the supporting substrate and the semiconductor device can be filled with the thermally reworkable composition by using standard equipment such as a syringe or a motionless mixer that mixes the components of the thermally reworkable composition and precisely dispenses the composition on one or more sides of the device to fill the gap.

Solder bumps, typically about 95 parts lead to 5 parts tin alloy, provide the means of chip attachment to the substrate for subsequent usage and testing. For further discussion of the controlled collapse chip connection technique of face down bonding of semiconductor chips to substrate see U.S. Pat. Nos. 3,401,126 and 3,429,040, which are hereby incorporated by reference. Typically solder bumps are formed on the passivated semiconductor device contact site while lower melting solder on the corresponding substrate pads flow and form conductive paths between the device and the substrate.

Usually, the semiconductor devices are mounted substrates made of materials with coefficients of expansion that differ from the coefficient of expansion of the material of the semiconductor device, i.e. silicon.

The thermally reworkable composition typically contain filler from about 25%, preferably about 40%, to about 75%, preferably to about 60% by weight of the binder based on the weight of the composition (resin and filler). The filler can be any inorganic filler suitable for semiconductor packaging applications such as high purity fused or amorphous silica or synthetic glass commercial fillers. The filler can be optionally treated with a coupling agent such as a silane.

Typically the filler and the resin should be at least substantially free from the ionic impurities such as chloride, sodium and potassium (less than 20 ppm each). The process of the invention provides a process which eliminates most of the ionic impurities found in the traditional processes using epoxy resin based binders.

Further, the thermally reworkable composition in the gap can be worked and/or reworked at a temperature where the thermally reworkable composition melts. Typically, the reworkable composition can be worked and/or reworked at a temperature within the range from about 100° C., preferably from about 130° C., to about 250° C., preferably to about 200° C. If the resin is heated for an extended period of time at high temperature, for instance, for 12 hours at 200° C., the resin undergoes irreversible crosslinking and it is no longer thermally reversible.

The thermally reworkable flip chip encapsulant composition can also contain other additives such as ion scavengers (e.g. tricalcium phosphate), free radical inhibitors (e.g. hydroquinone, phenothiazine), elastomeric modifiers (e.g. silicones) and other conventional additives used in flip chip encapsulant compositions. For a longer reworking time, it is preferable to use ion scavengers and/or free radical inhibitors.

Flip chips are bonded to various substrates such as ceramic or organic chip carriers and multicomponent printed circuit board substrates. The carrier may also be a multichip module in which several chips are mounted at close spacing on a single carrier. In a lot of cases, substrate and device costs are high and manufacturers cannot afford to reject the entire substrate if one or more defective flip chips are discovered during testing. The present invention enables the user to replace defective chips easily without having to throw the entire package away. The invention also can enable the user to eliminate a testing step that is typically done prior to encapsulation since the thermally reworkable flip chip encapsulant composition of the present invention permits easy rework and repair.

The encapsulated flip chip assembly between the substrate and semiconductor device made by the process of the invention can be reworked by heating the solder connections and the thermally reworkable composition filled in the gap at a temperature which is sufficiently high to melt or soften the solder connection and to convert the thermally reworkable composition into a liquid thereby providing a liquid composition. Then the semiconductor device and the liquid composition from the supporting substrate is removed to provide a device-removed support. If it is desirable to provide a new device to the substrate, another device can optionally be attached to the device-removed support after site redress (cleanup and re-depositing of solder and/or solder flux on the substrate pads if necessary) by reflowing the solder on the substrate pads to form conductive connections between the device and the substrate to form a gap between said supporting substrate and said another device, then filling the thus-formed gap with a fresh thermally reworkable composition comprising:

(i) a thermally reworkable crosslinked resin produced by reacting at least one dienophile having a functionality of greater than one and at least one 2,5-dialkyl substituted furan-containing polymer, and (ii) at least one filler present from about 25 to about 75 percent by weight based upon the amount of components and (i) and (ii).

The fresh reworkable composition filled in the gap is cooled to a temperature which is sufficiently low to solidify the resin thereby producing a reworked assembly.

The thermally reworkable composition can be postbaked to enhance the thermal and mechanical properties (e.g., glass transition temperature and mechanical strength). In order to preserve the thermal reversibility of the crosslinked resin, the thermally reworkable composition can be post-heated to a temperature within the range from about 50° C., preferably from about 80° C., to about 200° C., preferably to about 160° C. for a period of time up to about 4 hours. If thermal reversibility is not required the binder composition can be postbaked at a temperature within the range of from about 150° C., preferably from about 180° C., to about 300° C., preferably to about 250° C. for a period of time up to about 4 hours to improve the thermal properties.

ILLUSTRATIVE EMBODIMENT

The following illustrative embodiments describe the novel resin composition of the invention and are provided for illustrative purposes and are not meant as limiting the invention.

Example 1

An autoclave was charged with methanol and propene (approximately 1.7:1 weight ratio), heated to 90° C., and then charged with carbon monoxide to a pressure of 72 bar. A catalyst solution of palladium acetate, 1,3-bis (diethylphosphino)-propane, trifluoromethane sulfonic acid, in a weight ratio of 0.6:0.62: 1 and 0.3 pyridine, in a tetrahydrofuran, and methanol solution (15:1 volume ratio) were injected and the reactor pressure was maintained constant at 72 bar during the reaction by means of a continuous supply of carbon monoxide. Removal of solvent yielded an alternating propene/CO copolymer with a number average molecular weight of 733.

Example 2

An alternating olefin-CO copolymer (27% ethylene, 73% propylene) with a number average molecular weight of 1472 was prepared in a similar manner to Example 1 from propene and ethylene. The copolymer was dissolved in toluene and cyclized in the presence of a catalytic amount of p-toluene sulfonic acid by heating at reflux. The resulting polymer was analyzed by C-13 NMR which showed that 56% of the ketones in the starting polyketone were cyclized to furans (furan:ketone ratio 0.64:1) by the appearance of C-13 NMR signals (furan resonance) centered at around 107, 114, 147 and 153 ppm.

Example 3

A gel plate was set to 340° F. and the furanized polyketone made in Example 2 was dispensed onto the plate. A stoichiometric amount of toluene diamine bismaleimide (Compimide Resin TDAB, Technochemie Gmbh) was blended with the furanized polyketone until a homogeneous blend was obtained. The blend was removed from the gel plate and stored at room temperature.

Example 4

An ICI cone and plate viscometer was set to a temperature of 175° C. and allowed to equilibrate to the set point. A small amount of blend from Example 3 was placed on the plate and allowed to come up to temperature. The cone was brought down and spun to obtain a good film between the cone and plate. This was verified by lifting the cone up to check for good film formation. Subsequently the blend was allowed to equilibrate for 90 seconds and two viscosity readings were taken while the cone was rotating at a fixed speed. The cone was lifted up and the blend retrieved from both the cone and plate. The blend was allowed to cool at room temperature to a crosslinked solid. The above sequence of events i.e. load on ICI cone and plate, measure viscosity at 175° C., remove blend, cool to room temperature, was repeated three times with the same blend. The three consecutive readings for viscosity were 3–5 poise, 3–5 poise and 3–5 poise. This experiment shows that the blend can alternate reversibly between a crosslinked state at room temperature and a low viscosity uncrosslinked liquid at 175° C.

Example 5

The furanized polyketone made in Example 2 was blended with a stoichiometric amount of TDAB at 340° F. on a gel plate. The blend was cooled to room temperature. This blend was further mixed with silica filler (50% by weight of total formulation) at 340° F. The filled formulation was then removed from the gel plate and cooled to room temperature.

Example 6

An ICI cone and plate viscometer was set to a temperature of 175° C. and allowed to equilibrate to the set point. A small amount of blend from Example 5 was placed on the plate and allowed to come up to temperature. The cone was brought down and spun to obtain a good film between the cone and plate. This was verified by lifting the cone up to check for good film formation. Subsequently the blend was allowed to equilibrate for 90 seconds and two viscosity readings were taken while the cone was rotating at a fixed speed. The cone was lifted up and the blend retrieved from both the cone and plate. The blend was allowed to cool at room temperature to a crosslinked solid. The above sequence of events i.e. load on ICI cone and plate, measure viscosity at 175° C., remove blend, cool to room temperature was repeated three times with the same blend. The three consecutive readings for viscosity were 20–25 poise, 20–25 poise and 25–30 poise. This experiment shows that the blend can alternate reversibly between a crosslinked state at room temperature and an uncrosslinked liquid at 175° C.

Example 7

An autoclave was charged with methanol and propene (approximately 1.7:1 weight ratio), heated to 90° C., and then charged with carbon monoxide to a pressure of 72 bar. A catalyst solution of palladium acetate, 1,3-bis(di-o-methoxyphenylphosphino)propane, trifluoromethane sulfonic acid, in a molar ratio of 1:1.05:2.1, in a tetrahydrofuran and methanol solution (15:1 volume ratio) was injected two times and the reactor pressure was maintained at 72 bar during the reaction by means of a continuous supply of carbon monoxide. Removal of solvent yielded an alternating propene/CO copolymer with a number average molecular weight of 1765 and a furan: ketone ratio of 0.19:1.

Example 8

Furanized polyketone made in the previous example was blended with a stoichiometric amount of TDAB and 2.4% by weight of phenothiazine were blended on a gel plate at 340° F. The blend was removed from the gel plate and cooled to room temperature. The blend was reheated on the gel plate and mixed with silica filler (50% by weight of the total formulation. The filled formulation was removed from the gel plate and cooled to room temperature.

Example 9

A solder-masked 8-ply (epoxy-glass fabric) printed circuit board was placed on the gel plate at 340° F. and allowed to heat for 2 minutes. A flip chip was placed on the board and the filled blend made in the previous example was allowed to underfill the chip from two sides of the chip for 2–3 minutes. The board was removed from the hot surface and allowed to cool to room temperature. The chip stayed adhered to the board by means of the crosslinked formulation between the device and the board. The board was placed back on the gel plate. Within 40 seconds, the chip could be detached from the board since the formulation had changed state from a crosslinked solid to a liquid. A flip chip was then adhered to the original site by means of the adhesive already present on the site. The board was removed from the gel plate and cooled to room temperature. The board was placed back on the hot surface and the above remove and re-attach procedure was repeated two more times.

Example 10

An alternating propene-CO copolymer (54.4% head-to-tail) with a number average molecular weight of 1616 prepared in a similar manner to Example 1, except that 1,3-bis(di-o-methoxyphenylphosphino)propane was used in the catalyst solution instead of 1,3-bis(diethylphosphino) propane. The copolymer was dissolved in toluene and cyclized in the presence of a catalytic amount of p-toluene sulfonic acid by heating at reflux. The resulting polymer was analyzed by C-13 NMR which showed that 57% of the ketones in the starting polyketone were cyclized to furans (furan:ketone ratio 0.66:1).

Example 11

Furanized polyketone made in Example 10 and a stoichiometric amount of TDAB along with 6.5% by weight of phenothiazine were heated to 180° C., mixed and poured in a ⅛ inch thick metal mold. The mold was cooled quickly and the resulting casting was tested for properties. The flexural modulus of the sample was found to be 628 ksi, a value similar to that of a crosslinked epoxy made with bisphenol-A epoxy cured with an anhydride hardener. The dielectric constant and dissipation factor were 3.17 and 0.013 respectively.

Example 12

Furanized polyketone made in Example 7 was reacted with a 2:1 stoichiometric ratio of methylene dianiline bis-maleimide (Compimide Resin MDAB, Technochemie Gmbh), 0.1 mole of phenothiazine/mole of MDAB and 0.015 gm of 2-ethyl hexanoic acid/gm of furanized polyketone. A differential scanning calorimetry scan was performed on the sample at a ramp rate of 20° C./min. The onset of the glass transition temperature occured at 105° C.

Example 13

Furanized polyketone made in Example 4 was reacted with a stoichiometric amount of TDAB and 0.1 moles of phenothiazine/mole of TDAB on a gel plate at 340° F. This sample was ground and placed in a Parr bomb with water in a 10:1 ratio (water:sample). The Parr bomb was kept at 60° C. for 20 hours and the water extract was analyzed for ions by ion chromatography. The extract contained 14 ppm acetate, <3 ppm glycolate, formate, propionate, <0.25 ppm chlorine, <1 ppm nitrate, 1.7 ppm sulfate, 4.8 ppm sodium, 0.8 ppm magnesium, 2.5 ppm calcium and 0.2 ppm ammonium ion.

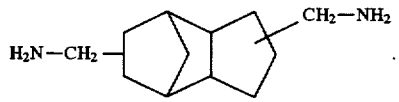

We claim:

1. An encapsulated flip chip assembly comprising:
   a supporting substrate;
   at least one semiconductor device attached to said supporting substrate by means of a plurality of solder connections that extend from said supporting substrate to form a gap between said supporting substrate and said semiconductor device; and a thermally reworkable binder filling said gap, said thermally reworkable binder comprising:
(a) a thermally reworkable crosslinked resin produced by reacting at least one dienophile having a functionality greater than one and at least one 2,5-dialkyl substituted furan-containing polymer, and
(b) at least one filler present in an amount from about 25 to about 75 percent by weight based upon the amount of components (a) and (b) thereby providing an assembly.

2. The flip chip assembly of claim 1 wherein the crosslinked resin is reworkable at a temperature within the range of from about 100° C. to about 250° C.

3. The flip chip assembly of claim 2 wherein the dienophile is an alkyne having electron withdrawing groups attached to both sides of an ethyne moiety.

4. The flip chip assembly of claim 3 wherein the dienophile is selected from the group consisting of compounds containing but-2-ene-1,4-dione moieties in 5-membered rings, and compounds containing but-2-ene-1,4-dione moieties in 6-membered rings.

5. The flip chip assembly of claim 2 wherein the thermally reworkable resin further comprises a residue of a crosslinking agent selected from the group consisting of, bismaleimido-capped poly(alkylene oxide)s, bismaleimido-capped polysiloxanes, bismaleimides of hydrazine, 2,4-diaminotoluene, hexamethylenediamine, dodecamethylenediamine, and diamines of the formula:

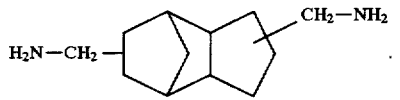

6. The flip chip assembly of claim 1 wherein the 2,5-dialkyl substituted furan-containing polymer is produced by reacting carbon monoxide with at least one olefinically unsaturated compound.

7. The flip chip assembly of claim 6 wherein the olefinically unsaturated compound is an aliphatic α-olefin.

8. The flip chip assembly of claim 7 wherein the α-olefin is propene.

9. The flip chip assembly of claim 2 wherein the polymer from which it is produced has a number average molecular weight in the range of 500–30,000.

10. The flip chip assembly of claim 4 wherein the 2,5-dialkyl furan-containing polymer has a furan groups to ketone groups ratio of from about 1:16 to about 4:1.

11. The flip chip assembly of claim 2 wherein the 2,5-dialkyl substituted furan groups in the 2,5-dialkyl substituted furan-containing polymer and the dienophiles are combined in a molar ratio of from about 10:1 to about 1:5.

12. The flip chip assembly of claim 2 wherein the dienophile is a crosslinking agent containing two or more dienophiles in its molecular structure.

13. The flip chip assembly of claim 2 wherein the thermally reworkable crosslinked resin is produced by reacting at least one dienophile having a functionality of greater than one and two or more 2,5-dialkyl substituted furan-containing polymer.

14. The flip chip assembly of claim 2 wherein the thermally reworkable crosslinked resin comprises moieties of a 2,5-dialkyl substituted furan and moieties of a dienophile.

15. The flip chip assembly of claim 1 further comprising (c) a free radical inhibitor and/or an ion scavenger.

16. A process of providing an encapsulated flip chip assembly comprising the steps of:
attaching at least one semiconductor device to a supporting substrate by a plurality of solder connections that extend from the supporting substrate to said semiconductor device to form a gap between said supporting substrate and said semiconductor device,
filling said gap with a thermally reworkable flip chip binder comprising:
(a) a thermally reworkable crosslinked resin produced by reacting at least one dienophile having a functionality greater than one and at least one 2,5-dialkyl substituted furan-containing polymer, and
(b) at least one filler present in an amount from about 25 to about 75 percent by weight based upon the amount of components (a) and (b) thereby providing a flip chip assembly.

17. The process of claim 16 further comprising the steps of:
heating the encapsulated flip chip assembly at a temperature which is sufficiently high to melt or soften the solder connections and to convert the thermally reworkable composition into a liquid thereby providing a liquid composition,
removing the semiconductor device from the supporting substrate providing a device-removed substrate.

18. The process of claim 17 further comprising the steps of:
cleaning said device-removed supporting substrate free of solder and the thermally reworkable flip chip binder thereby providing a cleaned-supporting substrate,
attaching a second semiconductor device to said cleaned-supporting substrate by a plurality of solder connections that extend from the said supporting substrate to said second semiconductor device to form a gap between said supporting substrate and said second semiconductor device,
filling said gap with a fresh thermally reworkable flip chip binder comprising:
(i) a thermally reworkable crosslinked resin produced by reacting at least one dienophile having a functionality of greater than one and at least one 2,5-dialkyl substituted furan-containing polymer, and
(ii) at least one filler present from about 25 to about 75 percent by weight based upon the amount of components and (i) and (ii), and
cooling the fresh thermally reworkable composition filled in the gap to a temperature which is sufficiently low to solidify the resin thereby producing a reworked assembly.

19. The process of claim 17 wherein the crosslinked resin is heated at a temperature within the range of from about 100° C. to about 250° C.

20. The process of claim 18 wherein the 2,5-dialkyl substituted furan-containing polymer is produced by furanizing a copolymer of carbon monoxide and at least one olefinically unsaturated compound.

21. The process of claim 16 further comprising heating the assembly at a temperature within the range of 70° C. to 200° C. for a period of up to 4 hours.

22. The process of claim 16 further comprising heating the assembly at a temperature within the range of 150° C. to 300° C. for a period of up to 4 hours.

23. The process of claim 16 wherein the 2,5-dialkyl substituted furan-containing polymer is produced by reacting carbon monoxide with at least one olefinically unsaturated compound.

24. The process of claim 20 wherein the olefinically unsaturated compound is an aliphatic α-olefin.

25. The process of claim 24 wherein the α-olefin is propene.

26. A method of reworking an encapsulated flip chip assembly comprising the steps of:

heating the encapsulated flip chip assembly comprising at least one semiconductor device attached to a supporting substrate by a plurality of solder connections that extend from the supporting substrate to the semiconductor device to form a gap between said supporting substrate and said semiconductor device, and a thermally reworkable flip chip binder filling said gap, said thermally reworkable flip chip binder comprising
(a) a thermally reworkable crosslinked resin produced by reacting at least one dienophile having a functionality greater than one and at least one 2,5-dialkyl substituted furan-containing polymer, and
(b) at least one filler present in an amount from about 25 to about 75 percent by weight based upon the amount of components (a) and (b), at a temperature which is sufficiently high to melt or soften the solder connections and to convert the thermally reworkable composition into a liquid thereby providing a liquid composition, removing the semiconductor device from the supporting substrate providing a device-removed substrate.

27. The method of claim 26 further comprising the steps of:

cleaning said device-removed supporting substrate free of solder and the thermally reworkable flip chip binder thereby providing a cleaned-supporting substrate, attaching a second semiconductor device to said cleaned-supporting substrate by a plurality of solder connections that extend from the said supporting substrate to said second semiconductor device to form a gap between said supporting substrate and said second semiconductor device, filling said gap with a fresh thermally reworkable flip chip binder comprising:

(i) a thermally reworkable crosslinked resin produced by reacting at least one dienophile having a functionality of greater than one and at least one 2,5-dialkyl substituted furan-containing polymer, and
(ii) at least one filler present from about 25 to about 75 percent by weight based upon the amount of components and (i) and (ii), and cooling the fresh thermally reworkable composition filled in the gap to a temperature which is sufficiently low to solidify the resin thereby producing a reworked assembly.

28. The method of claim 27 wherein the 2,5-dialkyl substituted furan-containing polymer is produced by furanizing a copolymer of carbon monoxide and at least one olefinically unsaturated compound.

29. The flip chip assembly of claim 2 wherein the dienophile is a cyclic derivative of maleic anhydride of the formula:

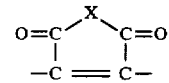

wherein X denotes O, S, N, P, or R wherein R is alkylene and wherein at least one of the free valencies is occupied by a bridging group which connects the dienophile with one of the polymer chains or with another dienophile and wherein the remaining valencies, if an, are occupied by hydrogen, lower alkyl substituents or acyl substituents.

30. The flip chip assembly of claim 5 wherein the residue of the cross-linking agent is selected from diamines of the general formula